United States Patent
Stay et al.

(10) Patent No.: US 9,980,394 B2
(45) Date of Patent: May 22, 2018

(54) BONDING ELECTRONIC COMPONENTS TO PATTERNED NANOWIRE TRANSPARENT CONDUCTORS

(71) Applicant: 3M INNOVATIVE PROPERTIES COMPANY, St. Paul, MN (US)

(72) Inventors: Matthew S. Stay, Minneapolis, MN (US); Mikhail L. Pekurovsky, Bloomington, MN (US); Shawn C. Dodds, St. Paul, MN (US); Ann M. Gilman, Woodbury, MN (US); Daniel J. Theis, Mahtomedi, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 54 days.

(21) Appl. No.: 14/897,521

(22) PCT Filed: Jul. 18, 2014

(86) PCT No.: PCT/US2014/047212
§ 371 (c)(1),
(2) Date: Dec. 10, 2015

(87) PCT Pub. No.: WO2015/017143
PCT Pub. Date: Feb. 5, 2015

(65) Prior Publication Data
US 2016/0143153 A1    May 19, 2016

Related U.S. Application Data

(60) Provisional application No. 61/860,841, filed on Jul. 31, 2013.

(51) Int. Cl.
*G02F 1/1345*    (2006.01)
*H05K 3/28*    (2006.01)
(Continued)

(52) U.S. Cl.
CPC ............ *H05K 3/284* (2013.01); *G06F 3/041* (2013.01); *G06F 3/047* (2013.01); *G06F 3/0412* (2013.01);
(Continued)

(58) Field of Classification Search
None
See application file for complete search history.

(56) References Cited

U.S. PATENT DOCUMENTS

| 6,975,067 | B2 | 12/2005 | McCormick |
| 2008/0143906 | A1 | 6/2008 | Allemand et al. |

(Continued)

FOREIGN PATENT DOCUMENTS

| CN | 102120920 A | 7/2011 |
| JP | 2013-077435 | 4/2013 |

(Continued)

OTHER PUBLICATIONS

Sun, "Polyol Synthesis of Uniform Silver Nanowires: A Plausible Growth Mechanism and the Supporting Evidence"; Nano Letters, 2003, vol. 3, No. 7, pp. 955-960.

(Continued)

*Primary Examiner* — James Dudek
(74) *Attorney, Agent, or Firm* — James A. Baker (57) ABSTRACT

A method for making an electronic assembly includes applying a conductive adhesive to a resist layer overlying a patterned conductive nanowire layer on a substrate and engaging an electrical contact of an electronic component with the conductive adhesive to provide an electrical connection between the electronic component and the conductive nanowire layer.

17 Claims, 4 Drawing Sheets

(51) Int. Cl.
*G06F 3/041* (2006.01)
*G06F 3/047* (2006.01)
*H05K 1/02* (2006.01)
*H05K 1/09* (2006.01)
*H05K 3/10* (2006.01)
*H05K 3/04* (2006.01)
*H05K 3/32* (2006.01)
*H05K 1/03* (2006.01)

(52) U.S. Cl.
CPC ........... *H05K 1/028* (2013.01); *H05K 1/0296* (2013.01); *H05K 1/09* (2013.01); *H05K 1/097* (2013.01); *H05K 3/048* (2013.01); *H05K 3/103* (2013.01); *H05K 3/323* (2013.01); *G06F 2203/04103* (2013.01); *G06F 2203/04112* (2013.01); *H05K 1/0393* (2013.01); *H05K 2201/026* (2013.01); *H05K 2201/10128* (2013.01); *H05K 2203/0143* (2013.01); *H05K 2203/1469* (2013.01); *H05K 2203/1545* (2013.01)

(56) References Cited

U.S. PATENT DOCUMENTS

| | | | |
|---|---|---|---|
| 2008/0171182 A1 | 7/2008 | Kawate et al. | |
| 2009/0283304 A1* | 11/2009 | Winoto | B82Y 10/00 174/257 |
| 2011/0155430 A1* | 6/2011 | Lee | C09J 9/02 174/257 |
| 2011/0253668 A1* | 10/2011 | Winoto | B82Y 10/00 216/13 |
| 2012/0247527 A1 | 10/2012 | Scullin et al. | |
| 2013/0004749 A1 | 1/2013 | Hao | |
| 2013/0161177 A1 | 6/2013 | Lee et al. | |
| 2013/0168138 A1 | 7/2013 | Yamazaki et al. | |
| 2015/0221413 A1* | 8/2015 | Abe | B82Y 30/00 428/447 |
| 2016/0044778 A1* | 2/2016 | Irie | G06F 3/044 174/257 |

FOREIGN PATENT DOCUMENTS

| WO | WO 2007-022226 | 2/2007 |
|---|---|---|
| WO | WO 2012-145157 | 10/2012 |
| WO | WO 2014-088950 | 6/2014 |

OTHER PUBLICATIONS

Sun, "Uniform Silver Nanowires Synthesis by Reducing $AgNO_3$ with Ethylene Glycol in the Presence of Seeds and Poly(Vinyl Pyrrolidone)"; Chemistry of Materials, 2002, vol. 14, No. 11, pp. 4736-4745.

International Search Report for PCT International Application No. PCT/US2014/047212, dated Nov. 6, 2014, 4pgs.

* cited by examiner

BONDING ELECTRONIC COMPONENTS TO PATTERNED NANOWIRE TRANSPARENT CONDUCTORS

CROSS REFERENCE TO RELATED APPLICATIONS

This application is a national stage filing under 35 U.S.C. 371 of PCT/US2014/047212, filed Jul. 18, 2014, which claims priority to U.S. Application No. 61/860,841, filed Jul. 31, 2013, the disclosure of which is incorporated by reference in its/their entirety herein.

BACKGROUND

Transparent conductors are utilized on touch screens to enable human touch or gesture interactions with computers, smart phones, and other graphics based screen interfaces. Nanowires are one material suitable for making the transparent conductors. For example, PCT publication WO 2007/022226, entitled "Nanowire-Based Transparent Conductors" discloses a nanowire material sold by Cambrios Technologies Corporation that can be patterned into a suitable grid to enable the production of touch screens for use with computers.

3M File No. 69879US003 describes a process for efficient production of touch screen devices in which a conductive material is patterned (e.g., printed) into electrical traces on a substrate. This process can be performed in a roll-to-roll process where the substrate is unwound, converting operations such as printing and drying/curing are performed, and then the patterned substrate is wound again into a roll for further transport and processing.

SUMMARY

The patterned conductive material formed by the processes described in 3M File No. 69879 can be connected to an electronic circuit component to produce an electronic assembly such as, for example, a touch sensor for use in a touch-screen display. The present disclosure is directed to processes for connecting the patterned conductive layers formed by the processes described in 3M File No. 69879US003 to electronic circuit components such as, for example, flexible circuits, to form an electronic assembly that can be used as a component of an electronic device. The present disclosure is further directed to electronic devices such as, for example, touch-screen displays, constructed using these interconnection processes.

In one embodiment, the present disclosure is directed to a method for making an electronic assembly includes applying a conductive adhesive to a resist layer overlying a patterned conductive nanowire layer on a substrate and engaging an electrical contact of an electronic component with the conductive adhesive to provide an electrical connection between the electronic component and the conductive nanowire layer.

In another embodiment, the present disclosure is directed to an electronic assembly including a substrate having thereon a pattern of conductive nanowires, wherein the conductive nanowires are overlain by a layer of a resist matrix material; a conductive adhesive on the layer of resist matrix material; and an electrical contact of an electronic component in contact with the conductive adhesive.

In yet another embodiment, a touch screen display includes a liquid crystal display and an electronic assembly. The electronic assembly includes a glass substrate on the liquid crystal display, wherein the glass substrate has thereon a pattern of conductive nanowires. The conductive nanowires are overlain by a layer of a resist matrix material. A conductive adhesive resides on the layer of resist matrix material; and an electrical contact of an flexible circuit is in contact with the conductive adhesive. A flexible transparent surface overlies the electronic assembly.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawing are directed to like elements.

DETAILED DESCRIPTION

Figure 1:
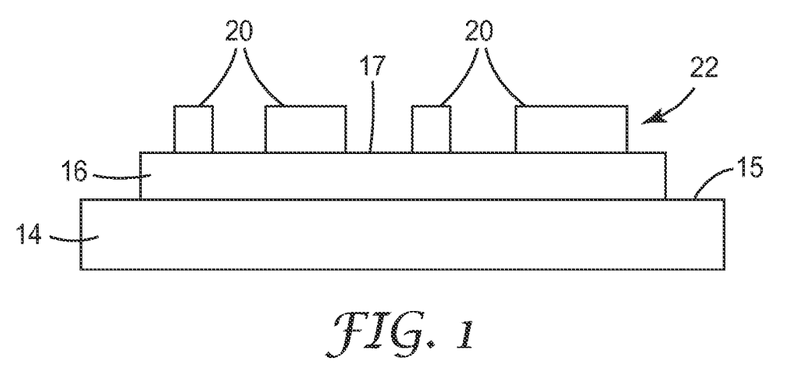
FIG. 1 is a schematic, cross-sectional view of a conductive nanowire layer on a substrate, wherein the conductive nanowire layer is overlain by a patterned resist matrix material.

Referring now to FIG. 1, a substrate 14 is coated with a conductive layer 16 including nanowires. The conductive nanowire layer 16 is substantially continuous over at least a portion of a first major surface 15 of the substrate 14 and desirably over at least 50%, 60%, 70%, 80%, or 90% of the area of the first major surface. The conductive nanowire layer 16 may be coated continuously along the substrate, or may be applied in discrete blocks or rectangles, leaving uncoated substrate areas between them, with the blocks or rectangles having a size similar to the overall size of the intended touch screen being produced. By "substantially continuous" it is meant the nanowires are applied at a sufficient density to render the surface of the substrate conductive, it being recognized that a nanowire layer will include individual wires with openings or spaces between them as shown in, for example, FIG. 15B in WO 2007/022226.

The conductive nanowire layer 16 includes conductive nanowires. In this application, the term nanowire refers to conductive metal or non-metallic filaments, fibers, rods, strings, strands, whiskers, or ribbons having high aspect ratios (e.g., higher than 10). Examples of non-metallic conductive nanowires include, but are not limited to, carbon nanotubes (CNTs), metal oxide nanowires (e.g., vanadium pentoxide), metalloid nanowires (e.g., silicon), conductive polymer fibers and the like.

As used herein, "metal nanowire" refers to a metallic wire including elemental metal, metal alloys or metal compounds (including metal oxides). At least one cross sectional dimension of the metal nanowire is less than 500 nm, or less than 200 nm, and more preferably less than 100 nm. As noted, the metal nanowire has an aspect ratio (length:width) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and polyvinyl pyrrolidone). Large-scale production of silver nanowires of uniform size can be prepared according to the methods described in, e.g., Xia, Y. et al., *Chem. Mater.* (2002), 14, 4736-4745, and Xia, Y. et al., *Nanoletters* (2003) 3(7), 955-960. More methods of making nanowires, such as using biological templates, are disclosed in WO 2007/022226.

In certain embodiments, the nanowires are dispersed in a liquid and a nanowire layer on the substrate is formed by coating the liquid containing the nanowires onto the substrate and then allowing the liquid to evaporate (dry) or cure. The nanowires are typically dispersed in a liquid to facilitate more uniform deposition onto the substrate by using a coater or sprayer.

Any non-corrosive liquid in which the nanowires can form a stable dispersion (also called "nanowire dispersion") can be used. Preferably, the nanowires are dispersed in water, an alcohol, a ketone, ethers, hydrocarbons or an aromatic solvent (benzene, toluene, xylene, etc.). More preferably, the liquid is volatile, having a boiling point of no more than 200 degrees C. (° C.), no more than 150° C., or no more than 100° C.

In addition, the nanowire dispersion may contain additives or binders to control viscosity, corrosion, adhesion, and nanowire dispersion. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene gylcol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl FSN, Zonyl FSO, Zonyl FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

If it is desired to change the concentration of the dispersion from that disclosed above, the percent of the solvent can be increased or decreased. In preferred embodiments the relative ratios of the other ingredients, however, can remain the same. In particular, the ratio of the surfactant to the viscosity modifier is preferably in the range of about 80:1 to about 0.01:1; the ratio of the viscosity modifier to the nanowires is preferably in the range of about 5:1 to about 0.000625:1; and the ratio of the nanowires to the surfactant is preferably in the range of about 560:1 to about 5:1. The ratios of components of the dispersion may be modified depending on the substrate and the method of application used. The preferred viscosity range for the nanowire dispersion is between about 1 and 1000 cP (0.001 and 1 Pa-s).

The substrate 14 in FIG. 1 can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate (PEN), and polycarbonate (PC)), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Optionally, the surface of the substrate can be pre-treated to prepare the surface to better receive the subsequent deposition of the nanowires. Surface pre-treatments serve multiple functions. For example, they enable the deposition of a uniform nanowire dispersion layer. In addition, they can immobilize the nanowires on the substrate for subsequent processing steps. Moreover, the pre-treatment can be carried out in conjunction with a patterning step to create patterned deposition of the nanowires. As described in WO 2007/02226, pre-treatments can include solvent or chemical washing, heating, deposition of an optional patterned intermediate layer to present an appropriate chemical or ionic state to the nanowire dispersion, as well as further surface treatments such as plasma treatment, ultraviolet radiation (UV)-ozone treatment, or corona discharge.

The nanowire dispersion that forms the nanowire layer 16 can be applied to the substrate at a given thickness selected to achieve desired optical and electrical properties. This application is performed using known coating methods, such as slot coating, roll coating, Mayer rod coating, dip coating, curtain coating, slide coating, knife coating, gravure coating, notch bar coating or spraying, yielding a conductive nanowire layer on the substrate. The nanowire layer 16 may also be deposited non-continuously using a printing technique including, but not limited to, gravure, flexographic, screen, letterpress, ink jet printing, and the like. This coating step can be performed either as a roll-to-roll process or in a piece-part fashion.

Following the deposition, the liquid of the dispersion is typically removed by evaporation. The evaporation can be accelerated by heating (e.g., using a dryer). The resulting conductive nanowire layer may require post-treatment to render it more electrically conductive. This post-treatment can be a process step involving exposure to heat, plasma, corona discharge, UV-ozone, or pressure as further described in WO 2007/02226. Optionally coating the substrate with a nanowire layer can be followed by hardening or curing the nanowire layer.

Optionally, the conductive nanowire layer 16 can be coated onto the substrate 14 by a process wherein the layer is delivered to the substrate surface 15 using means other than liquid dispersion coating. For example, a nanowire layer can be dry-transferred to a substrate surface from a donor substrate. As a further example, nanowires can be delivered to a substrate surface from a gas phase suspension.

In one specific embodiment, a layer of aqueous dispersion of nanowires (for example, dispersions available from Cambrios under the trade designation ClearOhm Ink) was applied to a PET substrate in the range 10.0 to 25 microns thick using a slot die coating technique. The coating formulation (e.g. % total solids by wt. and % silver nanowire solids by wt.) can be selected, along with the coating and drying process conditions, to create a nanowire layer with designed electrical and optical properties, e.g. a desired sheet resistance (Ohm/Sq) and optical properties such as transmission (%) and haze (%).

The conductive nanowire layer 16 that results from coating nanowires on a substrate (e.g., from a nanowire dispersion) includes nanowires and optionally binder or additives. The nanowire layer preferably includes an interconnected network of nanowires. The nanowires that make up the nanowire layer are preferably electrically connected to each other, leading approximately or effectively to a sheet conductor. The nanowire layer includes open space between the individual nanowires that make up the layer, leading to at least partial transparency (i.e., light transmission). Nanowire layers having an interconnected network of nanowires with open space between the individual nanowires may be described as transparent conductor layers.

Typically, the optical quality of the nanowire layer 16 can be quantitatively described by measureable properties including light transmission and haze. "Light transmission" refers to the percentage of an incident light transmitted through a medium. In various embodiments, the light transmission of the conductive nanowire layer is at least 80% and can be as high as 99.9%. In various embodiments, the light transmission of the conductive layer such as the nanowire layer is at least 80% and can be as high as 99.9% (e.g., 90% to 99.9%, 95% to 99.5%, 97.5% to 99%). For a transparent conductor in which the nanowire layer is deposited or laminated (e.g., coated) on a substrate (e.g., a transparent substrate), the light transmission of the overall structure may be slightly diminished as compared with the light transmission of the constituent nanowire layer. Other layers that may be present in combination with the conductive nanowire layer and the substrate, such as an adhesive layer, anti-reflective layer, anti-glare layer, may improve or diminish the overall light transmission of the transparent conductor. In various embodiments, the light transmission of the transparent conductor comprising a conductive nanowire layer deposited or laminated on a substrate and one or more others layers can be at least 50%, at least 60%, at least 70%, at least 80%, at least 90%, or at least 91%, and may be as high as at least 91% to 99%.

Haze is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. In accordance with ASTM Standard No. D1003-11, haze can be defined as the proportion of transmitted light that is deflected by an angle greater than 2.5 degrees. In various embodiments, the haze of the conductive nanowire layer is no more than 10%, no more than 8%, no more than 5%, no more than 2%, no more than 1%, no more than 0.5%, or no more than 0.1% (e.g., 0.1% to 5% or 0.5 to 2%). For a transparent conductor in which the conductive nanowire layer is deposited or laminated (e.g., coated) on a substrate (e.g., a transparent substrate), the haze of the overall structure may be slightly increased as compared with the haze of the constituent nanowire layer. Other layers that may be present in combination with the conductive nanowire layer and the substrate, such as an adhesive layer, anti-reflective layer, anti-glare layer, may improve or diminish the overall haze of the transparent conductor comprising a nanowire layer. In various embodiments, the haze of the transparent conductor comprising a conductive nanowire layer deposited or laminated on a substrate can be no more than 10%, no more than 8%, no more than 5%, no more than 2%, no more than 1%, no more than 0.5%, or no more than 0.1% (e.g., 0.1% to 5% or 0.5 to 2%). "Clarity" is the proportion of transmitted light that is deflected by an angle less than 2.5 degrees.

The sheet resistance, transmission, and haze of the conductive nanowire layer 16 can be tailored by varying certain attributes of the layer and its constituent materials such as the nanowires. Regarding the nanowires, they can be varied, for example, in composition (e.g., Ag, Cu, Cu—Ni alloy, Au, Pd), length (e.g., 1 micrometer, 10 micrometers, 100 micrometers, or greater than 100 micrometers), cross-sectional dimension (e.g., diameter of 10 nanometers, 20 nanometers, 30 nanometers, 40 nanometers, 50 nanometers, 75 nanometers, or greater than 75 nanometers). Regarding the conductive layer comprising the nanowires, it can be varied, for example, in its other components (e.g., cellulosic binders, processing aids such as surfactants, or conductance enhancers such as conducting polymers) or its area density of nanowires (e.g., greater than 10 per square millimeter, greater than 100 per square millimeter, greater than 1000 per square millimeter, or even greater than 10000 per square millimeter). Accordingly, the sheet resistance of the conductive layer or nanowire layer may be less than 1,000,000 Ohm/Sq, less than 1,000 Ohm/Sq, less than 100 Ohm/Sq, or even less than 10 Ohm/Sq (e.g., 1 Ohm/Sq to 1,000 Ohm/Sq, 10 Ohm/Sq to 500 Ohm/Sq, 20 Ohm/Sq to 200 Ohm/Sq, or 25 to 150 Ohm/Sq). The transmission of the conductive layer or nanowire layer may be at least 80% and can be as high as 99.9% (e.g., 90% to 99.9%, 95% to 99.5%, or 97.5% to 99%). The haze of the conductive layer or nanowire layer may be no more than 10%, no more than 8%, no more than 5%, no more than 2%, no more than 1%, no more than 0.5%, or no more than 0.1% (e.g., 0.1% to 5% or 0.5 to 2%).

Referring again to FIG. 1, a pattern of a resist matrix material is applied on the conductive nanowire layer 16 to generate on the substrate 14 one or more first regions 17 of exposed conductive nanowire layer and one or more second regions 22 of the resist matrix material (for example, a circuit pattern for a touch screen). The resist matrix material 20 can be applied to or patterned on the conductive nanowire layer 16, for example, by printing, and upon being so applied renders the conductive nanowire layer more adherent or protected on the substrate.

In certain embodiments, the matrix material 20 includes a polymer and desirably an optically clear polymer. Examples of suitable polymeric resist matrix materials include, but are not limited to: polyacrylics such as polymethacrylates, polyacrylates and polyacrylonitriles, polyvinyl alcohols, polyesters (e.g., polyethylene terephthalate (PET), polyester naphthalate (PEN), and polycarbonates (PC)), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbomenes, synthetic rubbers (e.g. EPR, SBR, EPDM), and fluoropolymers (e.g., polyvinylidene fluoride (PVDF), polytetrafluoroethylene (PTFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by DuPont Corp.).

In other embodiments, the resist matrix material 20 includes a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In some embodiments, the prepolymer is photo-curable, i.e., the prepolymer polymerizes and/or cross-links upon exposure to irradiation. Resist matrix materials based on photo-curable prepolymers can be patterned by exposure to irradiation in selective regions, or by selective placement of the prepolymer on the substrate followed by uniform exposure to irradiation. In other embodiments, the prepolymer is thermal-curable, which can be patterned in a similar manner, though exposure to a heat source is used in place of exposure to irradiation.

Typically, the resist matrix material 20 is applied as a liquid. The resist matrix material may optionally include a solvent (e.g., during application). Optionally, the solvent may be removed during the application process, for example before over-coating with the strippable polymer layer. Any non-corrosive solvent that can effectively solvate or disperse the matrix material can be used. Examples of suitable solvents include water, an alcohol, a ketone, an ether, tetrahydrofuran, hydrocarbons (e.g. cyclohexane) or an aromatic solvent (benzene, toluene, xylene, etc.). The solvent can be volatile, having a boiling point of no more than 200° C., no more than 150° C., or no more than 100° C.

In some embodiments, the resist matrix material 20 may include a cross-linker, a polymerization initiator, stabilizers (including, for example, antioxidants, and UV stabilizers for longer product lifetime and polymerization inhibitors for greater shelf-life), surfactants and the like. In some embodiments, the matrix material 20 may further include a corrosion inhibitor. In some embodiments, the resist matrix material itself is conductive. For example, the matrix can include a conductive polymer. Conductive polymers are known in the art, including without limitation: polyanilines, polythiophenes, and polydiacetylenes.

In some embodiments, the resist matrix material has a thickness of about 10 nanometers and about 300 nanometers, about 20 nanometers to about 200 nanometers, about 40 nanometers to 200 nanometers, or about 50 nanometers to 200 nanometers.

In some embodiments, the resist matrix material has a refractive index of between about 1.30 and 2.50, between about 1.40 and 1.70, or between about 1.35 and 1.80.

The resist matrix material 20 adds integrity to the conductive nanowire layer 16 and can promote improved adhesion of the conductive nanowire layer 16 to the surface 15 of the substrate 14.

Typically, the resist matrix material 20 is an optically clear material. A material is considered optically clear if the light transmission of the material is at least 80% in the visible region (400 nm-700 nm). Unless specified otherwise, all the layers (including the substrate) described herein are preferably optically clear. The optical clarity of the resist matrix material is typically determined by a multitude of factors, including without limitation: the refractive index (RI), thickness, smoothness, consistency of the RI throughout the thickness, surface (including interface) reflection, and scattering caused by surface roughness and/or embedded particles.

As discussed above, the resist matrix material 20 may be cured and/or hardened into a protective layer in selected regions forming a pattern over the conductive nanowire layer 16. "Cure or curing" refers to a process where monomers or partial polymers (e.g. oligomers comprising fewer than 150 monomer units) polymerize so as to form a solid polymeric matrix, or where polymers cross-link. Suitable polymerization or cross-linking conditions are well known in the art and include by way of example, heating the monomer, irradiating the monomer with visible or ultraviolet (UV) light, electron beams, and the like. Alternatively, "harden(s) or hardening" may be caused by solvent removal during drying of a resist matrix material, for example without polymerization or cross-linking.

The resist matrix material 20 is patterned by a suitable patterning process. Suitable patterning processes include subtractive methods such as photolithography (wherein the resist matrix material is a photoresist). Suitable patterning processes also include direct printing. As discussed above, hardening or curing of the printed resist occurs prior to the next process step. Suitable printers or patterning methods are known and include the illustrated flexographic printer, gravure printing, ink jet printing, screen printing, spray coating, needle coating, photolithographic patterning, and offset printing.

Suitable patterns involve features whose smallest dimension, either width or length, are greater than zero micron such as greater than 0.001 micron and less than 1 micron, less than 10 microns, less than 100 microns, less than 1 mm, or less than 10 mm. Any upper bound on the feature size is limited only by the size of the substrate on which printing occurs. In the case of roll-to-roll printing, this is effectively indefinite in the machine direction of the web. These features can take on any shape that can be patterned, such as stars, squares, rectangles, or circles. Often the features will be parallel lines or a grid sensitive to touch for use as a component in a touch screen.

Figure 2:
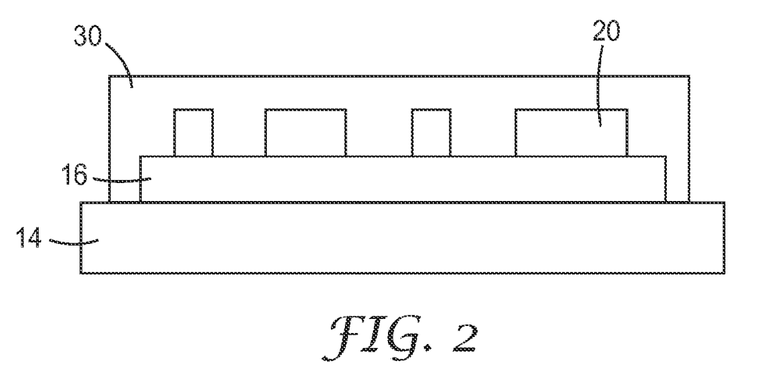
FIG. 2 is a schematic, cross-sectional view of the construction of FIG. 1 overlain by a strippable polymer layer.

Referring to FIG. 2, a strippable polymer material 30 is applied over the conductive nanowire layer 16 and the resist layer 20 on the substrate 14 (e.g., coated; or patterned, for example by printing, onto a one or more regions of the conductive nanowire layer 16 on the substrate 14). Upon being so applied, the strippable polymer material 30 renders the conductive nanowire layer 16 removable by peeling (e.g., in the one or more regions where the strippable polymer material 30 is patterned). In general, the strippable polymer material 30 applied to the conductive nanowire layer 16 is less adherent to the substrate than a resist matrix material applied to the same conductive nanowire layer coated on the substrate. In general, a strippable polymer material 30 applied to the resist matrix material 20 that is applied to the conductive nanowire layer 16 is less adherent to the resist matrix material 20 than the resist matrix material is adherent to the conductive nanowire layer 16.

Suitable strippable polymer materials readily coat and adhere to the conductive nanowire layer 16 while not unduly adhering to either the substrate 14 or the resist matrix material 20 such that the layer 30 can be peeled from both the resist matrix material 20 and the substrate 14. The selection of chemical composition for the strippable polymer layer 30 depends on the selection of the substrate 14, the resist matrix material 20, and the specific composition of the conductive nanowire layer 16.

One suitable strippable polymer layer comprises polyvinyl alcohol (PVA). It has been found in some embodiments that a molecular weight of approximately 8,000 to 9,000 Da for the PVA is preferred. A suitable commercially available coating composition comprising PVA is MacDermid's Print & Peel available from MacDermid Autotype, Inc., Rolling Meadows, Ill. Print and Peel is a water based screen printable varnish designed to be selectively printed onto a range of surface finishes to act as an easily removable protective mask. Surprisingly, it was found that the adhesion of this composition to the nanowire layer 16 was sufficient to completely remove it from the substrate 14 in unwanted areas while readily leaving the nanowire areas covered by the resist pattern 26 attached to the substrate during the subsequent peeling operation.

Another commercially available strippable polymer material is Nazdar 303440WB Waterbase Peelable Mask available from Nazdar Ink Technologies, Shawnee, Kans. Another suitable strippable polymer layer can be formulated by mixing poly vinyl alcohol (PVA) and Triton X-114 available from Union Carbide (or another suitable surfactant) and deionized water. One suitable formulation can comprise 20% by weight PVA (8,000 to 9,000 Da molecular weight), 2% by weight Triton X-114, and the balance deionized water.

Preferably, the strippable polymer layer 30 is delivered to the resist matrix material 20 patterned substrate 14 in a liquid state. The strippable polymer layer 30 is formed by applying a strippable polymer layer-forming liquid to the resist matrix material patterned substrate. A dryer can be optionally used to harden or cure the strippable polymer layer 30 after application by a coater. The strippable polymer layer-forming liquid is applied to the substrate using known application methods, such as slot coating, gravure coating, roll coating, flood coating, notch bar coating, spraying, thermal compression lamination, or vacuum lamination.

As shown in FIG. 1, the surface of the substrate 15 having a conductive nanowire layer 16 and a resist matrix material pattern 20 includes: i) one or more first regions 17 of exposed conductive nanowire layer 16 and ii) one or more second regions 22 of conductive nanowire layer overlain by resist matrix material. Generally, the resist matrix material regions are raised with respect to the exposed conductive nanowire layer regions. Generally, at the border between a resist matrix material region and an exposed conductive nanowire layer region, a change in relief exists. An example of such a change in relief is a step edge between the exposed conductive layer region and the resist matrix material region of the resist matrix material. The step edge may have a height (as approximated by the thickness of the resist matrix material in the aforementioned example) and it may have a lateral extent (e.g., distance, approximately in a plane parallel to the substrate, over which the step edge exists). Depending upon the change in relief, and depending upon the in-plane geometries of the resist matrix material and exposed conductive layer regions (e.g., shapes and sizes), making contact to substantially the entire exposed conductive material surface with the strippable polymer layer may be challenging. If a portion of the exposed conductive nanowire layer region is not contacted by the strippable polymer layer, that portion may not be removed successfully or with high pattern fidelity, during the subsequent peeling step. Accordingly, in some embodiments, the strippable polymer-forming liquid layer is applied to the resist matrix material patterned substrate, wherein at least 50%, preferably at least 75%, more preferably at least 90%, more preferably at least 95%, more preferably at least 99%, and most preferably 100% of the exposed conductive layer is contacted by the strippable polymer layer material.

Regarding the strippable polymer layer-forming liquid that is delivered to the resist matrix material patterned substrate, it may be a polymer solution, a polymer dispersion, a monomer solution, a monomer, a mixture of monomers, or a melt. The liquid may include minor amounts of secondary components (e.g., photoinitiators, surface active agents, viscosity modifiers). The strippable polymer layer is not delivered as a solid (e.g., a viscoelastic solid, such as a cross-linked pressure sensitive adhesive exhibiting appreciable yield stress that would limit the degree of contact between the adhesive and the exposed conductive or nanowire material in the exposed nanowire material regions). Application of the strippable layer in a liquid state leads to high resolution (high fidelity) patterning of the conductive or nanowire layer after peeling the strippable polymer layer from the resist matrix material patterned substrate.

The viscosity of the strippable polymer layer-forming liquid can be selected with consideration of the application method that will be used to deliver it to the resist matrix material patterned substrate. For example, for slot coating, roll coating, gravure coating, flood coating, notch bar coating, or spraying of a polymer solution, monomer, or monomer solution: the viscosity can be between 1 cps and 10,000 cps (0.001 and 10 Pa-s), preferably between 10 cps and 2,500 cps (0.01 and 2.5 Pa-s). For thermal compression or vacuum lamination of a polymer melt, the viscosity may be between 10,000 cps and 100,000,000 cps (10 Pa-s and 100 Pa-s). The strippable polymer layer-forming liquid preferably has zero yield stress. Some useful strippable polymer layer-forming liquids may develop a very low yield stress, preferably less than 100 Pa, more preferably less than 50 Pa, even more preferably less than 5 Pa, even more preferably less than 1 Pa.

The strippable polymer layer 30 is substantially continuous over at least a portion of the first major surface of the substrate and desirably over at least 50%, 60%, 70%, 80%, or 90% of the first major surface's area. The strippable polymer layer may be applied in discrete blocks or rectangles leaving uncoated substrate areas between them with the blocks or rectangles having a size similar to the overall size of the intended touch screen being produced. By "substantially continuous" it is meant the strippable polymer layer is applied over multiple patterned resist matrix material lines, traces, or discrete features such that the strippable polymer layer covers not only the patterned resist matrix material 20 but also the conductive nanowire layer 16 present between the patterned resist matrix material. Typically, a uniform thickness and continuous coating of strippable polymer material is applied over at least some portion of the substrate, but not necessarily the entire width or length of the substrate. For example, the middle portion of the substrate could be coated with the strippable polymer material while a strip or margin along each edge is left uncoated.

The approach described here has several advantages. First, by casting the strippable polymer layer from as a liquid, it is possible to create very intimate contact between the strippable polymer layer and the conductive nanowire layer. Second, this intimate contact prevents removed portions of the conductive nanowire layer from falling onto the substrate after the strippable polymer layer is removed, avoiding contamination of the substrate that could substantially decrease product yields. Finally, after the over coating step, the strippable polymer layer can remain in place during transportation, handling, and converting operations, serving as a protective film and eliminating the need for an additional liner to be applied after the fact, which could be the case if the conductive nanowire material were patterned using laser ablation.

Figure 3:
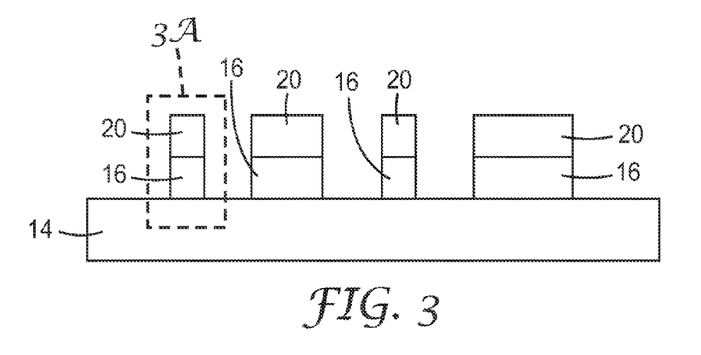
FIG. 3 is a schematic, cross-sectional view of the construction of FIG. 2 following removal of the strippable polymer layer.

The strippable polymer layer is applied with a sufficient thickness to cover both the patterned resist matrix material 20 and the conductive nanowire layer 16. Typical thicknesses for the strippable polymer layer are from about 2 μm to about 10 μm, or from 10 μm to 25 μm, or from 25 μm to 100 μm. After applying the strippable polymer layer, the layer is hardened or cured as needed. An optional dryer can be used to speed up the hardening or curing process. A thinner layer of strippable polymer material is preferred, since it requires less energy to remove the solvent from the coating composition, leading to faster drying, and therefore, processing times. In some embodiments, an optional premask (not shown in FIG. 2) may be laminated to a surface of the strippable polymer layer 30 to provide mechanical support during the peeling step. Referring now to FIG. 3, the strippable polymer layer 30 is peeled away. The strippable polymer layer 30 may be removed by a wide variety of techniques such as, for example, by passing the substrate 14 with all of the applied layers though a delaminating nip (not shown in FIG. 3). The strippable polymer layer 30 with attached conductive nanowire material 16 in areas of the substrate unprotected by the patterned (e.g., printed) resist matrix material 20 is removed from the substrate 14. Peeling the strippable polymer layer 30 from the substrate 14 removes the conductive nanowire material 16 in selected regions of the substrate thereby forming a patterned nanowire layer in which each region of the nanowire layer remaining on the substrate 14 is overlain by resist matrix material 20.

Figure 3A:
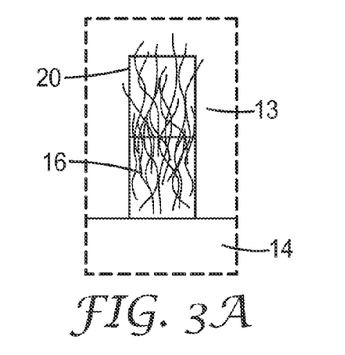
FIG. 3A is a schematic, cross-sectional view of a portion of the conductive nanowire layer following removal of the strippable polymer layer, and illustrating protruding nanowires.

FIG. 3A illustrates a magnified, schematic cross-sectional view of a region of the conductive nanowire layer 16 overlain by the resist matrix material 20 following removal of the strippable polymer layer. A plurality of nanowires 13 originate in the nanowire layer 16 and cross into the resist matrix material 20. The nanowires 13 protrude from the conductive nanowire layer 16 and the overlying resist matrix material 20. At least some of the nanowires 13 extend above the resist matrix material 20 and provide sites for further electrical interconnection with the conductive nanowire layer 16.

Figure 4:
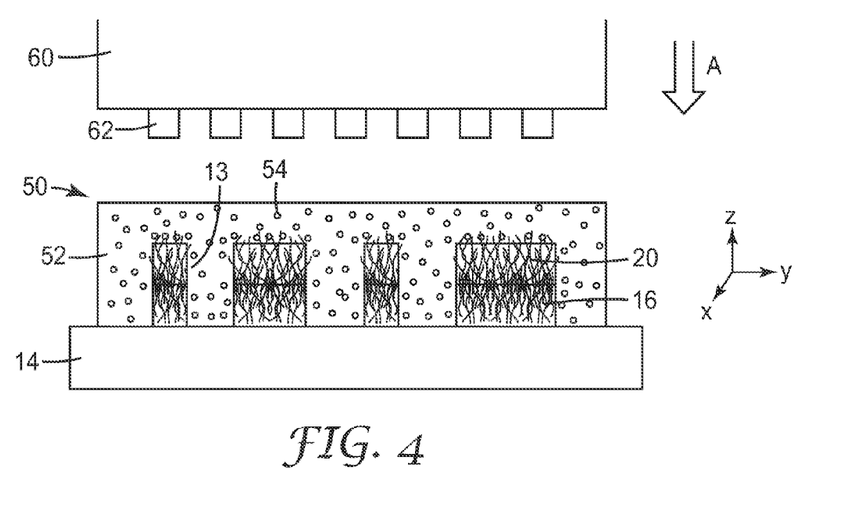
FIG. 4 is a schematic, cross-sectional view of the construction of FIG. 3 having applied thereon a conductive adhesive in preparation for bonding to an electronic component.

Referring to FIG. 4, a layer of a conductive adhesive 50 is applied to the pattern of the conductive nanowire layer 16, which is overlain by the resist matrix material 20. In some embodiments, the conductive adhesive layer 50 includes an adhesive matrix 52 with conductive materials 54. The conductive materials 54 include, but are not limited to, metal particles or scrim of silver, gold, copper, aluminum and the like, and mixtures thereof. The conductive materials 54 may provide conductivity through the adhesive matrix 52 through the thickness of the adhesive matrix 52, which is along the z direction as shown in FIG. 4. This conductivity along the z direction, but not along the other spatial directions, enables electrical connection between the nanowire layer 16 and a contact pad of an electronic component without inducing undesirable "shorts" between the contact pads in either the nanowire layer 16 or the electronic component. The conductive materials 54 in the adhesive layer 50 contact the nanowires 13 protruding from the resist matrix material 20 and form an electrical interconnection with the nanowires 13 in the conductive layer 16. This electrical interconnection in turn creates electrical contact between the conductive adhesive layer 50 and the conductive layer 16.

The conductive adhesive layer 50 may vary widely, but in some embodiments includes, but is not limited to, anisotropically conductive films available from 3M, St. Paul, Minn., under the trade designations 3M Anisotropically Conductive Film 5363, 7303, 7371, 7376, and 7379. These films include an adhesive matrix having therein with conductive particles. In some embodiments, the adhesive matrix is selected from an acrylate adhesive, an epoxy adhesive, a silicone adhesive, or a mixture or combination thereof. In various embodiments, the conductive particles include, but are not limited to, silver, gold, copper, aluminum and the like, and mixtures thereof, as well as other metals or nonconductive particles (for example, polymers) having a conductive coating made from, for example, silver, gold, copper, aluminum, and mixtures and combinations thereof.

In some embodiments, the conductive adhesives have a thickness of about 10 microns to about 50 microns, and are supplied on a strippable liner. Once the liner is removed, the conductive adhesive can be bonded to an electronic component with heat, pressure or a combination thereof. In some embodiments, the conductive adhesives can be bonded at a temperature of about 140° C. to about 170° C. under a bonding pressure of about 1-2 MPa.

In another embodiment, the conductive adhesive layer is a conductive transfer tape. A first major surface of the transfer tape is coated with a layer of a first conductive adhesive such as described above, and a second opposed side of the transfer tape is coated with a layer of a second conductive adhesive such as described above, which may be the same or different from the first conductive adhesive. Examples of suitable conductive transfer tapes include, but are not limited to, those available from 3M, St. Paul, Minn., under the trade designations 3M Electrically Conductive Adhesive Transfer Tape 8703, 9703, 9704 and 9705. These Adhesive Transfer Tapes include acrylic pressure sensitive adhesive matrices loaded with silver particles, and may conduct through the adhesive matrix along the z direction.

In various exemplary embodiments, these transfer tapes have a thickness of about 0.05 mm to about 0.55 mm, about 0.05 mm to about 0.10 mm, or about 0.05 mm to about 0.127 mm.

Referring again to FIG. 4, an electronic component 60 including metal contacts 62 (for example, conductive pads) may be moved along the direction of the arrow A until the metal contacts 62 engage the conductive adhesive layer 50. This physical engagement creates an electrical connection between the electronic component 60 and the adhesive layer 50, and in turn between the adhesive layer 50 and the conductive nanowire layer 16.

This direct bonding between the nanowire layer 16 and the electronic component 60 via the adhesive layer 50 mitigates the need for any other intermediate conductive paste or printed conductor between the metal contacts 62 of the electronic component 60 and the transparent nanowire layer 16, which simplifies the construction of the electronic assembly.

The electronic component may vary widely depending on the intended application, and in some embodiments includes a flexible circuit, a printed circuit board (PCB), a glass panel, or a pattern of wires.

Figure 5:
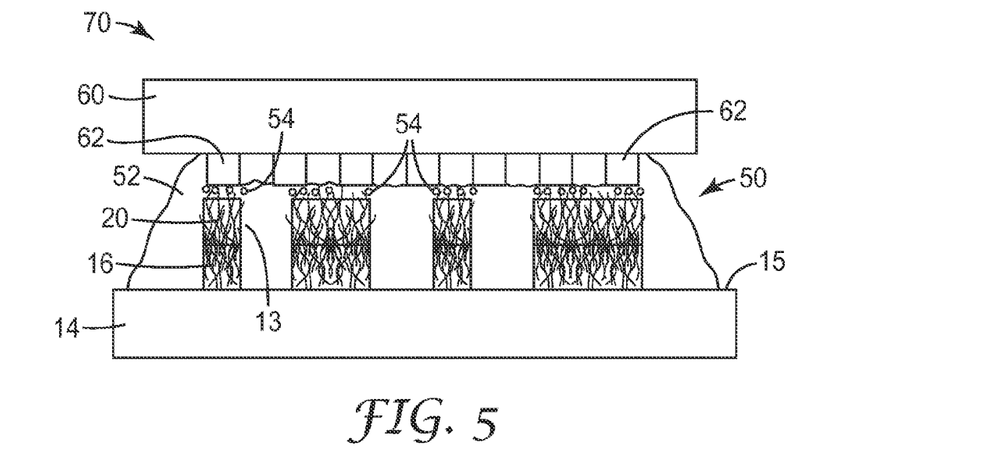
FIG. 5 is a schematic, cross-sectional view of a laminate construction including the construction of FIG. 4 bonded to the electronic component.

The contacts 62 on the electronic component 60 engage the conductive adhesive layer 50 to form a laminate electronic assembly construction 70 as shown in FIG. 5. The electronic assembly 70 includes a substrate 14 having on a surface 15 thereof a conductive layer 16 including nanowires 13. The conductive nanowire layer 16 is overlain with a resist matrix material 20, which also includes protruding nanowires 13. The protruding nanowires 13 contact the conductive materials 54 in the conductive adhesive layer 50, and the adhesive matrix 52 bonds the electronic component 60 to the substrate 14. The conductive materials 54 in the conductive adhesive layer 50 contact the metal contacts 62 on the electronic component 60, which ensures good electrical interconnection between the electronic component 60 and the conductive layer 16.

Figure 6:
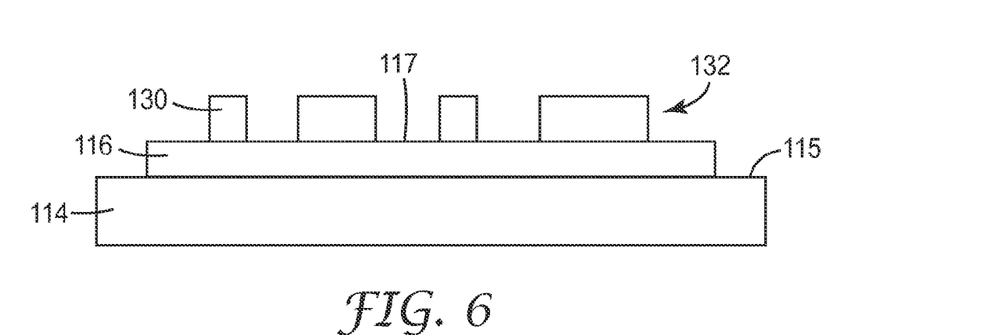
FIG. 6 is a schematic, cross-sectional view of a conductive nanowire layer on a substrate, wherein the conductive nanowire layer is overlain by a patterned strippable polymer layer.

Referring now to FIG. 6, in another embodiment, once a conductive layer 116 including nanowires is coated onto a substrate 114, a pattern can be applied to the layer with a strippable polymer material 130 to generate on the substrate one or more first regions 117 of exposed nanowire layers and one or more second regions 132 of the strippable polymer material (typically a pattern complementary to a circuit pattern for a touch screen).

The strippable polymer material 130 is patterned by a suitable patterning process. Suitable patterning processes include subtractive methods such as photolithography (wherein the strippable polymer material is a photoresist). Preferable patterning processes for the strippable polymer material include direct printing. As discussed above, hardening or curing of the strippable polymer material 130 occurs prior to the next process step. Suitable printers or patterning methods are known and include the illustrated flexographic printer, gravure printing, ink jet printing, screen printing, spray coating, needle coating, photolithographic patterning, and offset printing.

Suitable patterns involve features whose smallest dimension, either width or length, are greater than zero micron such as greater than 0.001 micron and less than 1 micron, less than 10 microns, less than 100 microns, less than 1 mm, or less than 10 mm. Any upper bound on the feature size is limited only by the size of the substrate on which printing occurs. In the case of roll-to-roll printing, this is effectively indefinite in the machine direction of the web. These features can take on any shape that can be patterned, such as stars, squares, rectangles, or circles. Often the features will be parallel lines or a grid sensitive to touch for use as a component in a touch screen.

Once a pattern of strippable polymer material (strippable polymer layer) 132 is applied to the conductive nanowire layer 116, it can be used to pattern the layer 116 in the next step. The strippable polymer material is peeled from the substrate, removing the conductive nanowire layer in one or more second regions of the substrate 132 and thereby forming a patterned conductive nanowire layer.

Figure 7:
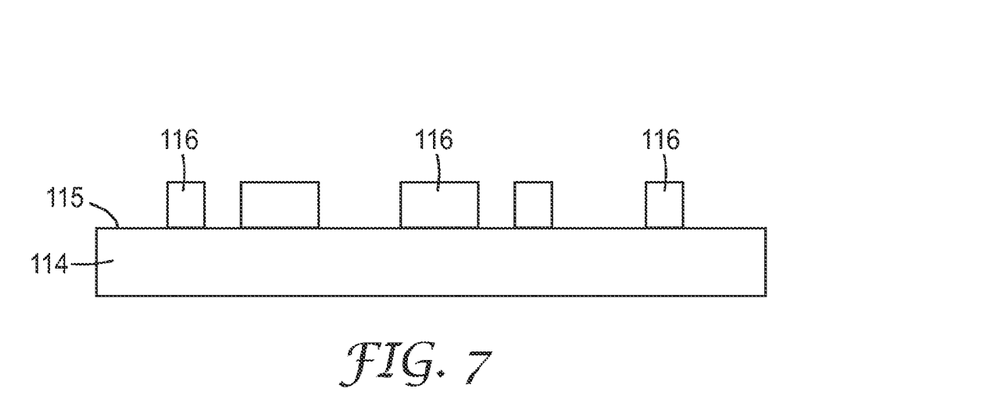
FIG. 7 is a schematic, cross-sectional view of the construction of FIG. 6 following removal of the strippable polymer layer.

Referring now to FIG. 7, the strippable polymer layer has been removed, which also removes the conductive nanowire layer 116 from regions underlying the strippable polymer layer. In regions not having the strippable polymer material patterned thereon, the conductive nanowire layer 116 remains on the substrate 114. As such, during the peeling step, the exposed areas of the conductive nanowire layer are not removed from the substrate by the liner. After removing the strippable polymer layer, a conductive adhesive layer can be applied as described above to electrically connect the conductive nanowire layer 116 to an electronic device.

Figure 8:
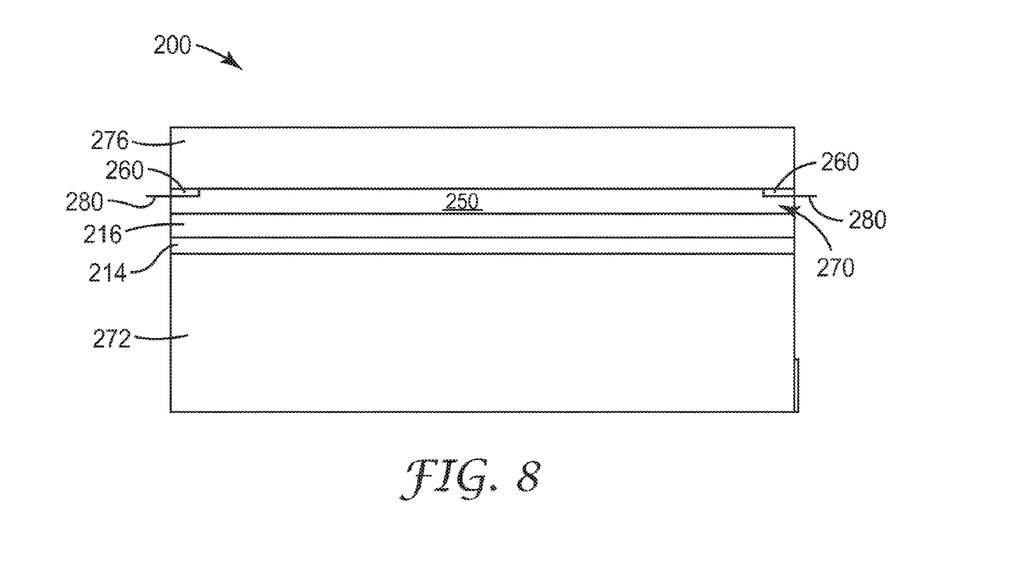
FIG. 8 is a schematic, cross-sectional view of a touch-screen display.

Referring to FIG. 8, an example of a touch-screen assembly 200 includes a LCD layer 272 adjacent to a layer of glass 214, which provides a substrate for an electronic assembly construction 270 (see FIG. 5). The electronic assembly construction 270 includes a conductive nanowire layer 216, which is electrically connected to flexible circuits 260 via a conductive adhesive layer 250 (see FIG. 5). Electrical traces 280 on the flexible circuits 260 connect the assembly 200 to components of a display device such as a computer, mobile phone, tablet, and the like. A flexible transparent surface 276 overlying the electronic assembly construction 270 provides a point of interaction with a user of the display device.

EXAMPLE

A mixture composed of 95% by weight ClearOhm™ Ink-N G4-02 (available from Cambrios Technologies Corporation, Sunnyvale, Calif.) and 5% by weight isopropyl alcohol (available from Sigma Aldrich, St. Louis, Mo.) was mixed by agitation in a 1 liter clear bottle to yield a coating formulation referred to below as a nanowire formulation.

The nanowire formulation was coated 6 inches (15 cm) wide onto 5 mil (0.13 mm) thick polyethylene terephthalate (PET) substrate (Melinex ST-504 film, available from Dupont, Wilmington, Del.) using a slot die, targeting a pre-metered wet film thickness of approximately 15.0 um at a web speed of 10 ft (3 m)/min to form a nanowire layer on the substrate. The nanowire layer was then heated to a temperature of 105° C. in air impingement oven for approximately 2 minutes, which resulted in a coated and dried transparent and electrically conductive nanowire layer.

The optical transmission and haze of the nanowire layer and substrate were measured with a Haze Gard Plus (BYK Gardner USA, Columbia, Md.) and determined to be 92.2% and 1.4%, respectively. The sheet resistance was measured to be between 50 and 75 Ohms/Sq., as determined by a two-point probe measurement.

A mixture of 2.5% by weight of UV-curable printing ink (Flint Group Print Media North America, Batavia, Ill.) and 97.5% by weight methyl ethyl ketone (MEK) was deposited as a pattern onto the nanowire-coated substrate by flexographic printing, using a patterned photopolymer stamp. The printed pattern consisted of an array of 3 mm wide downweb on a 6 mm pitch, and the flexographic tool used to make the pattern was fabricated by Southern Graphics Systems (SGS, Minneapolis, Minn.) based on an image that defined the pattern. The resist matrix material was printed at a speed of 10 m/min, using a 1.0 BCM/sq. in. anilox roll (rated to give a wet coating of approximately 0.3 to 2.0 microns). The mixture was passed through an air impingement oven to evaporate the MEK, and the resultant patterned UV-curable layers were irradiated with high intensity UV light in a nitrogen-purged atmosphere with a 236 Watt/cm$^2$ Fusion H bulb (available from Fusion UV Systems, Inc.).

A mixture composed of 99% by weight MacDermid Print and Peel (MacDermid Inc., Denver, Colo.) and 1.0% by weight Triton X-114 surfactant (available from Sigma-Aldrich, St. Louis, Mo.) was prepared for use as the strippable polymer layer. The strippable polymer composition was over-coated onto the patterned resist from the previous step using a #14 Meyer rod (available from R.D. Specialties, Webster, N.Y.), and then placed into an oven to dry for 2 minutes. Once the strippable coating was dry and cooled to room temperature, the film was peeled from the substrate, such that it lifted off the nanowires in the regions unprotected by the printed resist.

Two layers of 3M 8703 Electrically Conductive Adhesive Transfer Tape were applied to opposite and connecting ends of 10 of the 3 mm wide transparent electrodes. Two patterned copper flex tails were then aligned with the patterned transparent electrodes and laminated to the exposed 3M 8703 Electrically Conductive Adhesive. The flex circuits were then tested with a Kiethly multimeter to demonstrate isolated and conductive leads between ends of the flex circuit, confirming direct tail bonding between the transparent conductor and the pattern transparent nanowire layer.

Various embodiments of the invention have been described. These and other embodiments are within the scope of the following claims.

The invention claimed is:

1. A method for making an electronic assembly, comprising:
    applying a transfer tape to a resist layer overlying a patterned conductive nanowire layer on a substrate, wherein the transfer tape comprises a first side having thereon a first conductive adhesive layer contacting the resist layer, and a second side having thereon a second conductive adhesive layer, further wherein the first conductive adhesive layer comprises metal particles in an adhesive matrix; and
    engaging an electrical contact of an electronic component with the first conductive adhesive layer to provide an electrical connection between the electronic component and the conductive nanowire layer.

2. The method of claim 1, wherein the metal particles are selected from silver, gold, copper, aluminum, and combinations thereof.

3. The method of claim 1, wherein the adhesive matrix of the first conductive adhesive layer comprises an acrylic pressure sensitive adhesive, a thermally bonded adhesive, or combinations thereof.

4. The method claim 1, wherein the resist layer has a thickness of about 10 nanometers to about 300 nanometers.

5. The method of claim 1, wherein the resist layer has a thickness of about 40 nanometers to about 200 nanometers.

6. The method of claim 1, wherein the resist layer has a refractive index of about 1.30 to about 2.50.

7. The method of claim 1, wherein the patterned conductive nanowire layer on the substrate is produced by:
    coating a substrate with a conductive layer comprising nanowires;
    applying a pattern on the conductive layer with a resist matrix material to generate on the substrate one or more first regions of exposed conductive layer and one or more second regions of resist matrix material;
    hardening or curing the resist matrix material;
    over coating the pattern with a strippable polymer layer;
    hardening or curing the strippable polymer layer;
    peeling the strippable polymer layer from the substrate; and
    removing the exposed conductive layer from the substrate in the one or more first regions of the substrate to form a patterned conductive layer on the substrate, wherein the patterned conductive layer comprises nanowires overlain by the resist matrix material.

8. The method of claim 1, wherein the patterned conductive nanowire layer on the substrate is produced by:
    coating a substrate with a conductive layer comprising nanowires;
    applying a pattern on the conductive layer with a strippable polymer liquid-forming layer to generate on the substrate one or more first regions of exposed conductive layer and one or more second regions covered with the strippable polymer liquid-forming layer;
    hardening or curing the strippable polymer liquid-forming layer into a strippable polymer layer; and
    peeling the strippable polymer layer from the substrate and removing portions of the conductive layer in the one or more second regions of the substrate to form a patterned conductive layer on the substrate.

9. An electronic assembly, comprising:
    a substrate comprising thereon a pattern of conductive nanowires, wherein the conductive nanowires are overlain by a layer of a resist matrix material;
    a transfer tape on the layer of resist matrix material, wherein the transfer tape comprises a first side having thereon a first conductive adhesive layer, and a second side having thereon a second conductive adhesive layer contacting the resist matrix material, further wherein the second conductive adhesive layer comprises metal particles in an adhesive matrix; and
    an electrical contact of an electronic component in contact with the second conductive adhesive layer.

10. The electronic assembly of claim 9, wherein the resist matrix material has a thickness of about 10 nanometers to about 300 nanometers.

11. The electronic assembly of claim 9, wherein the resist matrix material has a thickness of about 40 nanometers to about 200 nanometers.

12. The electronic assembly of claim 9, wherein the adhesive matrix comprises a pressure sensitive adhesive, a thermally bonded adhesive or combinations thereof.

13. The electronic assembly of claim 12, wherein the first conductive adhesive layer is different from the second conductive adhesive layer.

14. The electronic assembly of claim 9, wherein the metal particles comprise silver, gold, copper, aluminum and combinations thereof.

15. The electronic assembly of claim 9, wherein the electronic component comprises a flexible circuit.

16. An electronic assembly made according to the process of claim 1.

17. A touch screen display comprising:
    a liquid crystal display;
    an electronic assembly comprising:
        a glass substrate on the liquid crystal display, wherein the glass substrate comprises thereon a pattern of conductive nanowires, wherein the conductive nanowires are overlain by a layer of a resist matrix material;
        a transfer tape on the layer of resist matrix material, wherein the transfer tape comprises a first side having thereon a first conductive adhesive layer, and a second side having thereon a second conductive adhesive layer contacting the resist matrix material, further wherein the second conductive adhesive layer comprises metal particles in an adhesive matrix; and
        an electrical contact of a flexible circuit in contact with the second conductive adhesive layer; and
    a flexible transparent surface overlying the electronic assembly.

* * * * *